United States Patent [19]

Matsuo et al.

[11] Patent Number: 5,747,843

[45] Date of Patent: May 5, 1998

[54] SEMICONDUCTOR MEMORY DEVICE

[75] Inventors: Hiroshi Matsuo; Shinya Watanabe; Yuichi Yokoyama; Shinya Inoue, all of Hyogo, Japan

[73] Assignees: Mitsubishi Denki Kabushiki Kaisha, Tokyo; Ryoden Semiconductor System Engineering Corporation, Hyogo, both of Japan

[21] Appl. No.: 667,684

[22] Filed: Jun. 21, 1996

[30] Foreign Application Priority Data

Nov. 9, 1995 [JP] Japan .................... 7-291223

[51] Int. Cl.$^6$ .................... H01L 27/108; G11C 5/02; G11C 13/00
[52] U.S. Cl. .................... 257/296; 365/51; 365/210
[58] Field of Search .................... 365/210, 51; 257/296

[56] References Cited

U.S. PATENT DOCUMENTS 5,361,234  11/1994  Iwasa .................... 365/210

*Primary Examiner*—Sara W. Crane
*Assistant Examiner*—Andrew W. Seacord, II
*Attorney, Agent, or Firm*—Lowe, Price, LeBlanc & Becker

[57] ABSTRACT

An improved semiconductor memory device in which an electric circuit operates normally is provided. A block of memory cells of a dynamic random access memory is provided on a semiconductor substrate. A dummy storage node is provided near a corner portion of the memory cell block. A dummy cell plate is provided such that it covers the dummy storage node and is electrically insulated from a main cell plate of the DRAM.

9 Claims, 10 Drawing Sheets

SEMICONDUCTOR MEMORY DEVICE

BACKGROUND OF THE INVENTION

1. Field of the Invention

The present invention relates to a semiconductor memory device. It particularly relates to a semiconductor memory device improved to prevent short-circuit between an Al (aluminum) interconnection and a cell plate at an end portion of a memory cell.

2. Description of the Background Art

An IC memory consists of a memory cell array including a number of memory elements, and a peripheral circuitry required for input/output. They are often formed on the same substrate.

Figure 10:
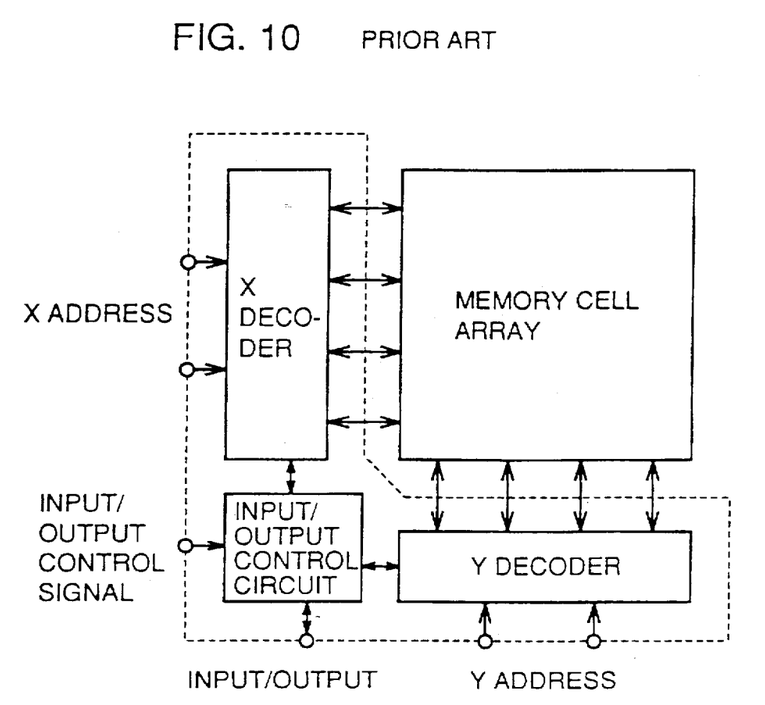
FIG. 10 shows the basic structure of the conventional DRAM.

FIG. 10 shows the basic structure of the conventional DRAM. An address signal designating the location of the cell to be addressed (i.e., a memory address) is input from X address and Y address, and writing into or reading from the address is performed by an input/output control signal.

A decoder is a circuit which selects an address by using the address signal.

Figure 11:
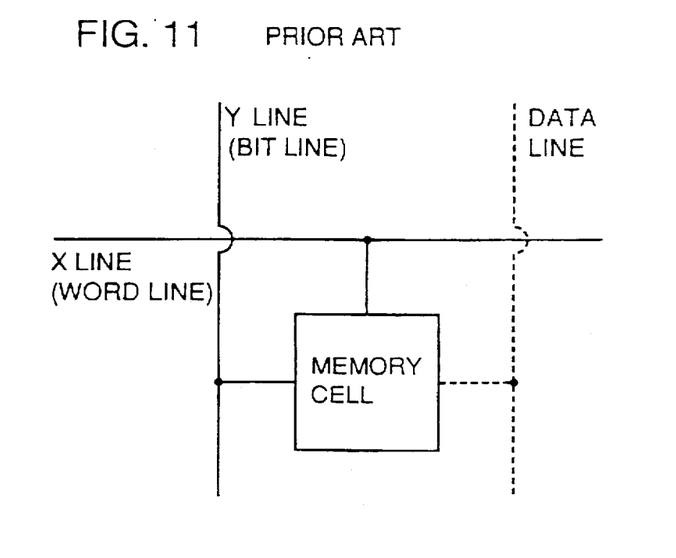
FIG. 11 shows the conventional interconnection to a memory cell.

Referring to FIGS. 10 and 11, an output of an X decoder and an output of a Y decoder are transmitted by an X line (a word line) and a Y line (a bit line), respectively, to a memory cell located at each address.

Figure 12:
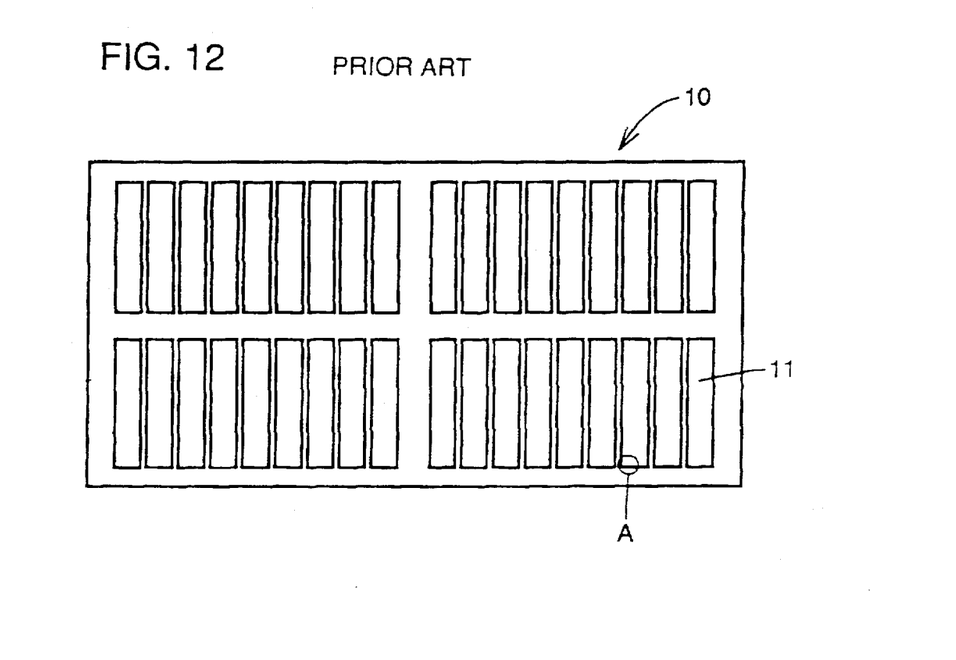
FIG. 12 is a plan view of the conventional memory cell array.

FIG. 12 is a plan view of a memory cell array. Referring FIG. 12, a memory cell array 10 includes a number of memory cell blocks 11.

Figure 13:
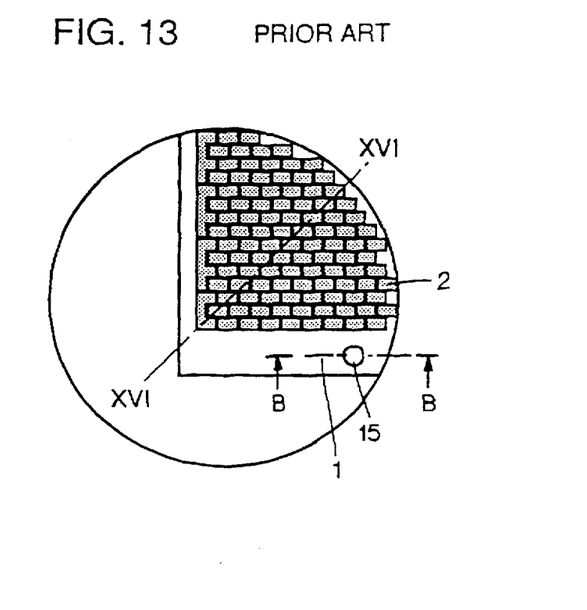
FIG. 13 is an enlarged view of the portion A of FIG. 12.

FIG. 13 is an enlarged view of the portion A of FIG. 12.

Each memory cell block 11 includes a storage node 2 and a cell plate 1 provided to cover storage node 2.

Figure 14:
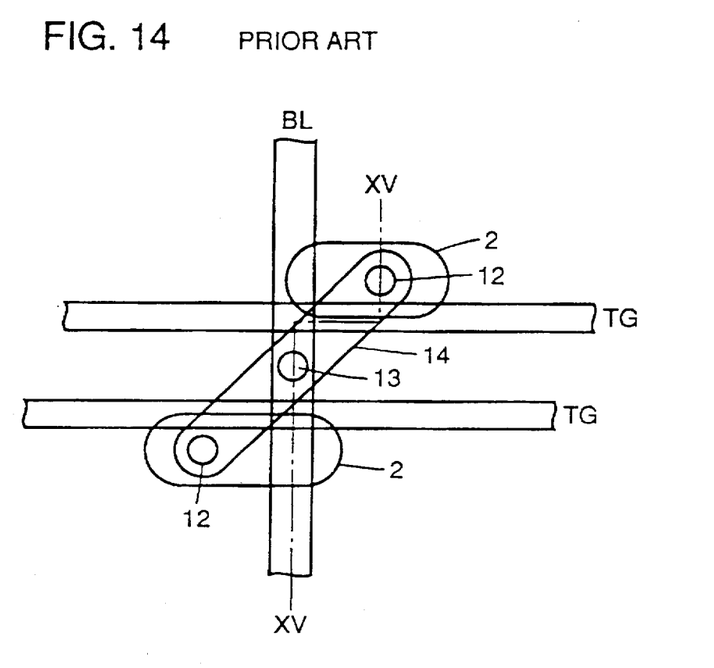
FIG. 14 is a detailed view of a storage node shown in FIG. 13.

FIG. 14 illustrates in detail the storage node. Storage node 2 is provided near a cross point of a bit line (BL) and a transfer gate (TG). A storage node contact 12 and a bit line contact 13 are formed within an active region 14.

Figure 15:
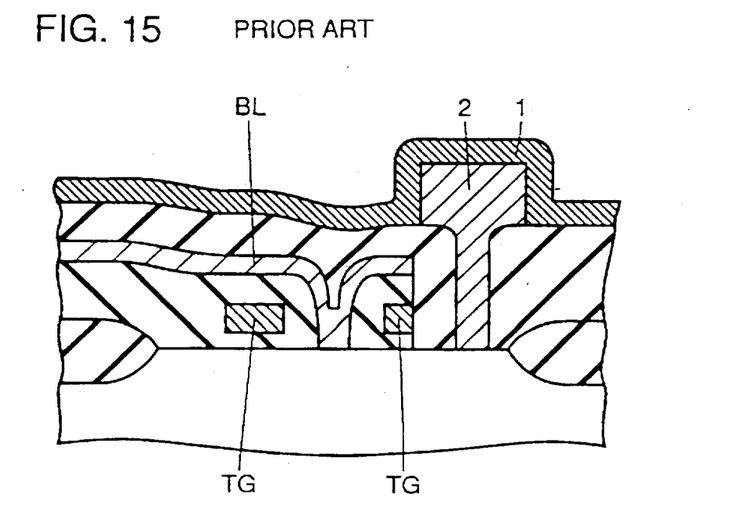
FIG. 15 is a cross sectional view taken along the line XV—XV of FIG. 14.

FIG. 15 is a cross sectional view taken along the line XV—XV of FIG. 14. Referring to FIG. 15, cell plate 1 is provided to cover storage node 2.

For the conventional DRAM, referring to FIGS. 12 and 13, edge portions of repeatedly-patterned storage nodes 2 are arranged lengthwise and widthwise at a corner portion of memory cell block 11, and they are entirely covered with cell plate 1.

Figure 16:
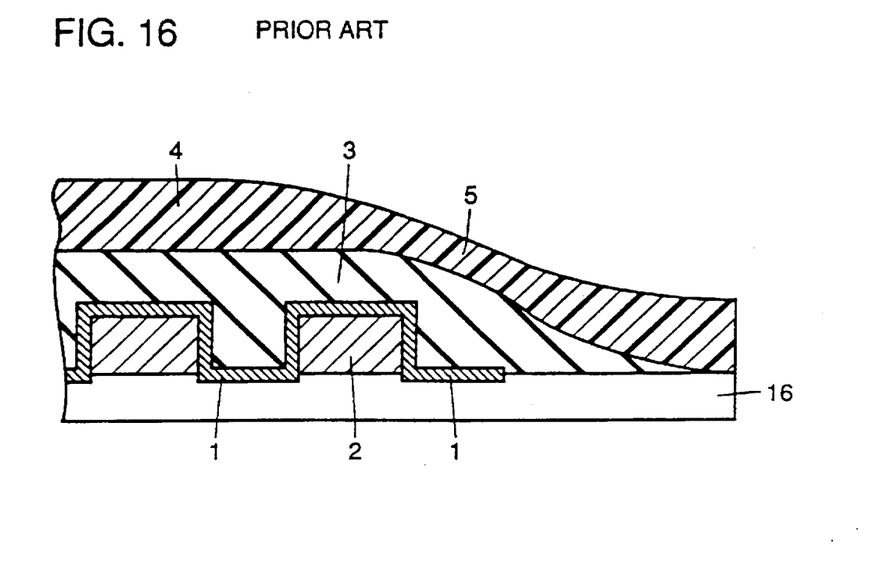
FIG. 16 is a cross sectional view taken along the line XVI—XVI of FIG. 13.

FIG. 16 is a cross sectional view taken along the line XVI—XVI of FIG. 13, illustrating a step of forming a cell plate contact 15.

Referring to FIG. 16, cell plate 1 is provided to cover storage node 2 formed on a semiconductor substrate 16. An interlayer film 3 is provided to cover cell plate 1. A resist 4 is provided on interlayer film 3.

Referring to FIG. 16, since level difference occurs at an end portion of memory cell block 11 by the thickness of storage node 2, a slope results at interlayer film 3. If resist 4 is applied with interlayer film 3 having a slope, a portion 5 of resist 4 having the minimum film thickness is produced at the slope of interlayer film 3. When a 16M DRAM is actually manufactured, the thickness of the resist 4 applied is 10,000 Å while the thinnest portion 5 of resist 4 has a thickness of 3,600 Å.

Figure 17A:
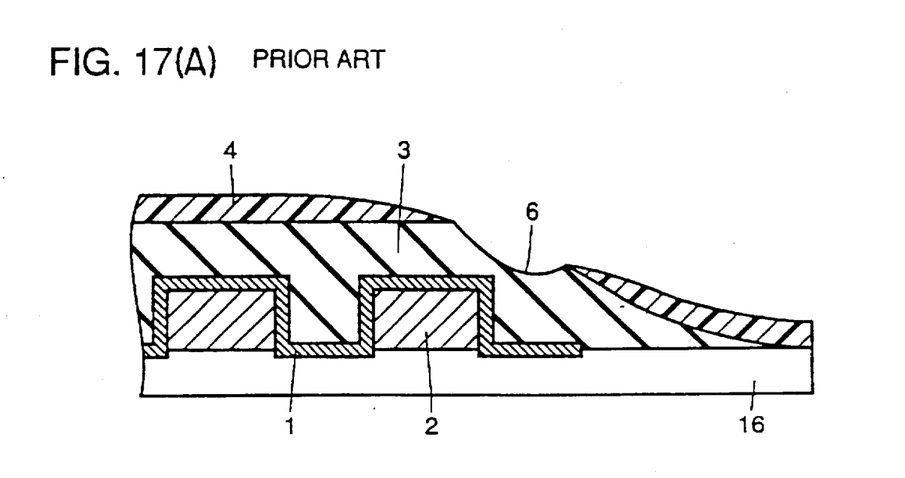
Figure 17B:
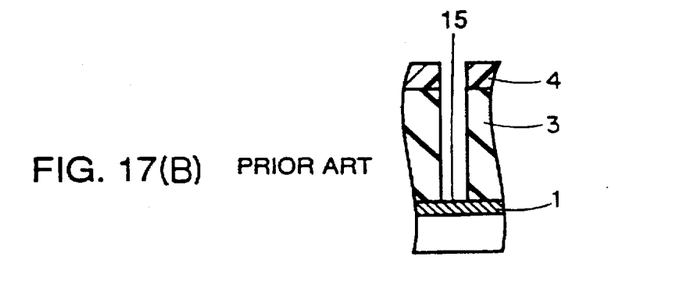
FIG. 17B is a cross section taken along line B—B in FIG. 13, showing a disadvantage of the conventional semiconductor memory device.

As a result, in etching interlayer film 3 to form contact 15 of cell plate 1 as shown in FIG. 17B, resist 4 is made thin and interlayer film 3 is exposed at portion 5 having the minimum resist thickness, as shown in FIG. 17A. As a result, etching of interlayer film 3 is suddenly started at portion 5 having the minimum resist thickness so that interlayer film 3 is scraped off and a recessed portion 6 is produced. Thus, in the process for forming an Al interconnection on interlayer film 3, short-circuit will occur at recess portion 6 between the Al interconnection (not shown) and cell plate 1. The possibility that such a defect may occur will increase if the etch selectivity of resist 4 and interlayer film 3 is not sufficiently large. As a result, a semiconductor memory device in which an electric circuit does not operate normally is manufactured.

The present invention is to solve the above problems. An object of the present invention is to provide an improved semiconductor memory device in which an electric circuit can operate normally.

A semiconductor memory device according to a first aspect of the present invention is provided with a semiconductor substrate. Provided on the semiconductor substrate is a block of memory cells of a dynamic random access memory. A dummy pattern of a storage node (referred to as "dummy storage node" hereinafter) is provided near a corner portion of the block of memory cells. A dummy pattern of a cell plate (referred to as "dummy cell plate" hereinafter) is provided such that it covers the dummy storage node and is electrically insulated from a main cell plate of the dynamic random access memory.

In the semiconductor memory device according to the first aspect of the present invention, the electric circuit will operate normally even if short-circuit occurs between the Al interconnection and the dummy cell plate, since the dummy plate is electrically insulated from the main cell plate.

A semiconductor memory device according to a second aspect of the present invention is provided with a semiconductor substrate. Provided on the semiconductor substrate is a block of memory cells of a dynamic random access memory. As a corner of the block of memory cells is pared off, the slope of the interlayer film is relaxed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 17A is a cross section taken along line XVI—XVI in FIG. 13, while

DESCRIPTION OF THE PREFERRED EMBODIMENTS

Hereafter, embodiments of the present invention will be described with reference to the figures.

(First Embodiment)

Figure 1:
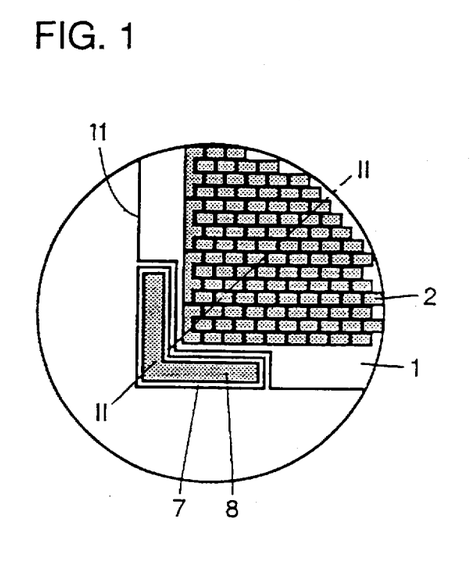
FIG. 1 is a plan view of a corner portion of a memory cell block of a semiconductor memory device according to a first embodiment of the present invention.

In a first embodiment of the present invention, a plan view of the memory cell array is the same as that of the conventional memory cell array shown in FIG. 12. An enlarged view of the portion A according to the first embodiment of the present invention is shown in FIG. 1. According to the present embodiment, a dummy storage node 8 is provided near a corner portion of a memory cell block 11. A dummy cell plate 7 is provided such that it covers dummy storage node 8 and is electrically insulated from a main cell plate 1 of a dynamic random access memory.

Figure 2:
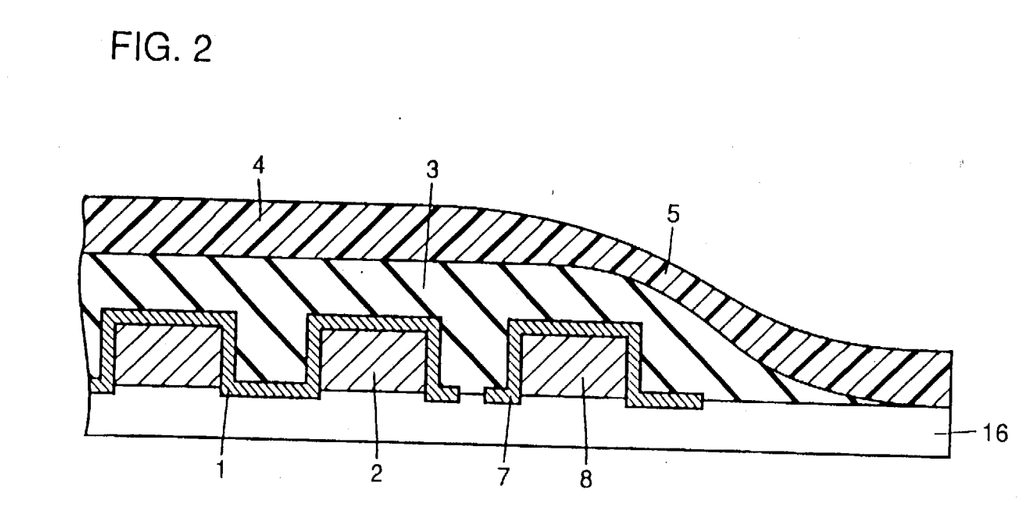
FIG. 2 is a cross sectional view taken along the line II—II of FIG. 1.

FIG. 2 is a cross sectional view taken along the line II—II of FIG. 1. As is apparent from FIG. 2, dummy cell plate 7 formed on a semiconductor substrate 16 is electrically insulated from main cell plate 1.

Figure 3:
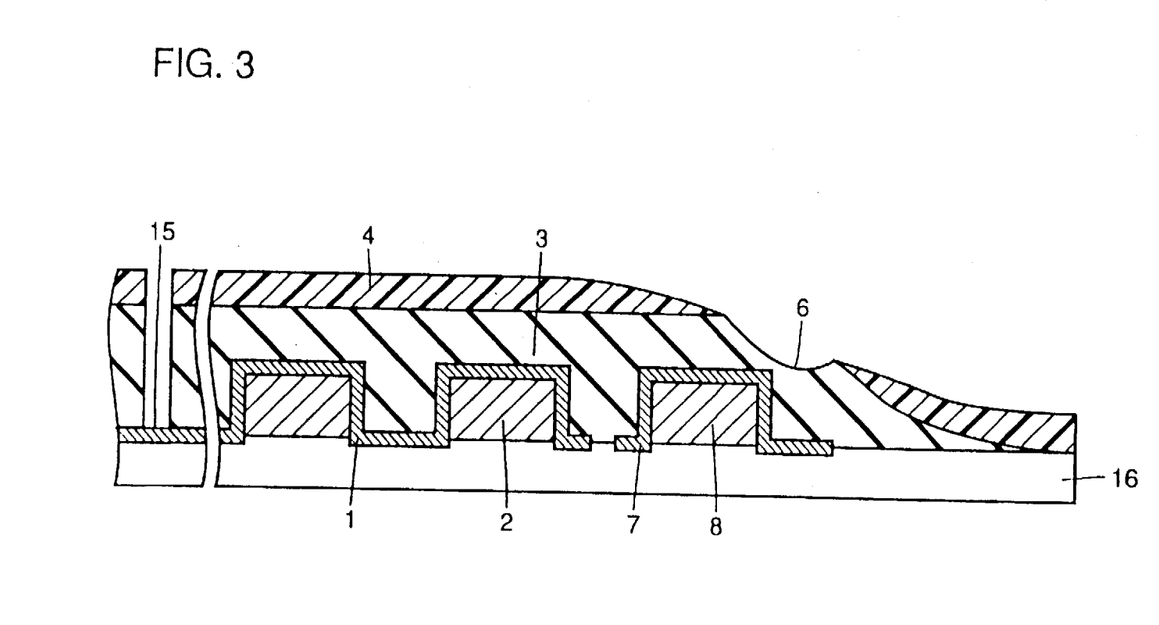
FIG. 3 is a cross sectional view of a semiconductor memory device in the step of forming a contact of a cell plate in a method of manufacturing a semiconductor memory device according to the first embodiment of the present invention.

Referring to FIGS. 2 and 3, even if in forming a contact 15 of the cell plate, an interlayer film 3 is scraped off at a portion 5 having the minimum resist thickness and a recessed portion 6 results and hence short-circuit occurs between an A1 interconnection (not shown) formed on interlayer film 3 and dummy cell plate 7, an electric circuit operates normally, since dummy cell plate 7 is electrically insulated from main cell plate 1.

(Second Embodiment)

Figure 4:
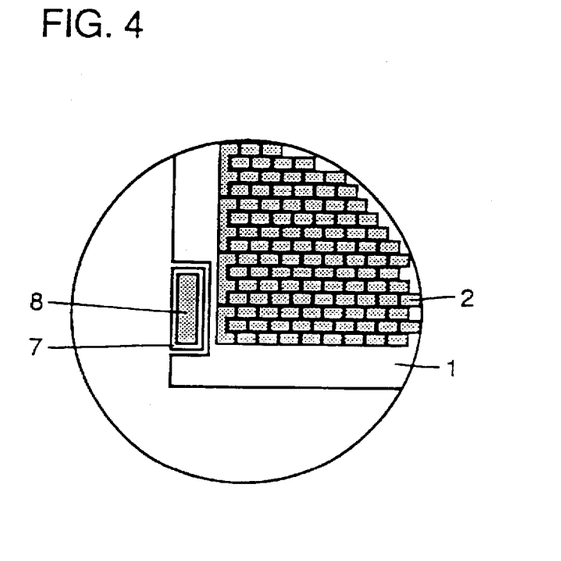
FIGS. 4, 5, 6, 7 and 8 are plan views of a corner portion of a memory cell block of a semiconductor device according to second, third, fourth, fifth and sixth embodiments of the present invention, respectively.

In the semiconductor memory device shown in FIG. 1, a case in which dummy storage node 8 is provided to surround a corner of a memory cell block is illustrated. However, the present invention is not limited to this example. That is, referring to FIG. 4, a similar effect is realized if dummy storage node 8 is formed only at one side of a corner portion of a memory cell block formed by one side and the other side.

(Third Embodiment)

Figure 5:
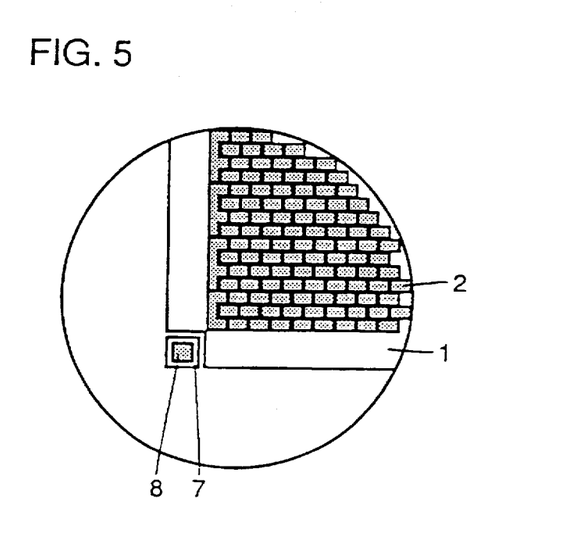

Referring to FIG. 5, a similar effect is realized if dummy storage node 8 is formed such that it has a square shape in the two dimensions.

(Fourth Embodiment)

Figure 6:
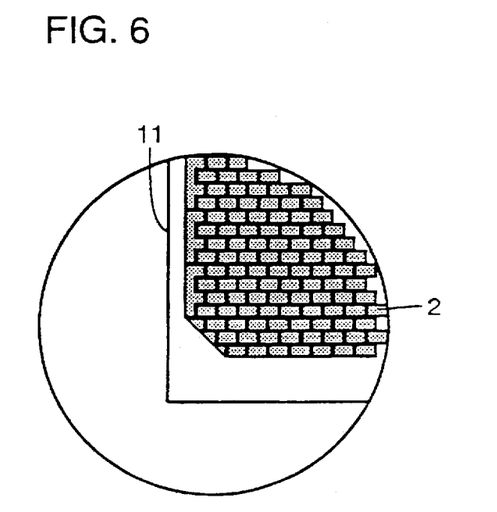
Figure 9:
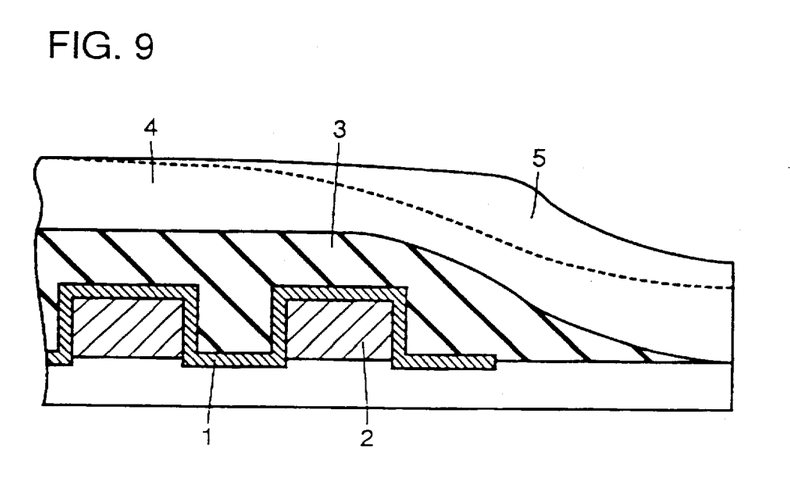
FIG. 9 illustrates function and effect of a method of manufacturing a semiconductor memory device according to the fourth embodiment of the present invention.

Referring to FIG. 6, memory cell block 11 of a dynamic random access memory is provided on a semiconductor substrate (not shown). A corner portion of the pattern of storage node 2 is pared off at an angle of 45°. The corner portion is pared off straight. As the corner of storage node 2 pattern is thus formed, the slope of interlayer film 3 will be relaxed and hence the thickness of portion 5 having the minimum resist thickness can be increased, as shown in FIG. 9. As a result, interlayer film 3 will not be scraped off when forming the contact of cell plate 1. Furthermore, shortcircuit will not occur between the A1 interconnection and cell plate 1. In FIG. 9, the slope of the conventional resist layer shown in FIG. 16 is also shown by the dotted line.

(Fifth Embodiment)

Figure 7:
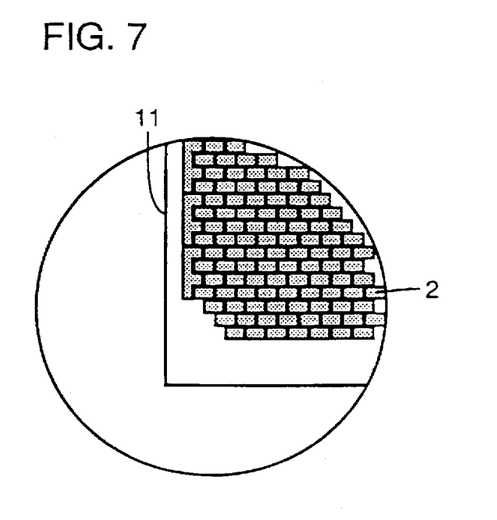

In the fourth embodiment, a case in which the corner of the pattern of the storage node is pared off stepwise is illustrated. However, the present invention is not limited to this example. That is, a similar effect is achieved if the corner is pared off stepwise in the two dimensions, as shown in FIG. 7.

(Sixth Embodiment)

Figure 8:
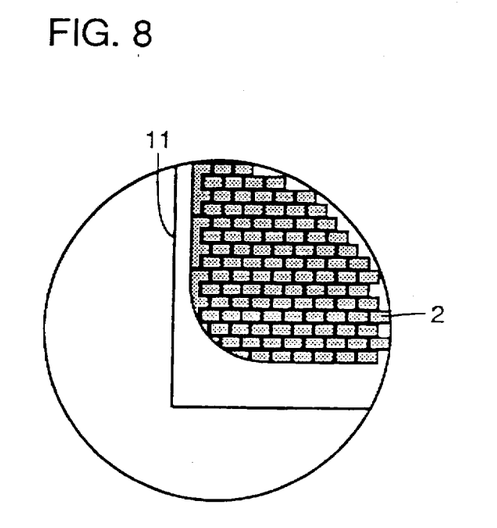

In the above embodiments, the corner of the pattern of the storage node is paired off straight or stepwise. However, the present invention is not limited to these examples. That is, a similar effect is realized if the corner is pared off arcuately, as shown in FIG. 8.

In the semiconductor memory device according to the first aspect of the present invention, the electric circuit will operate normally even if short-circuit occurs between the A1 interconnection and the dummy cell plate, since the dummy plate is electrically insulated from the main cell plate.

A semiconductor memory device according to a second aspect of the present invention is provided with a semiconductor substrate. Provided on the semiconductor substrate is a block of memory cells of a dynamic random access memory. As a corner of the block of memory cells is pared off, the slope of the interlayer film is relaxed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a semiconductor substrate;

a block of memory cells of a dynamic random access memory provided on said semiconductor substrate;

a dummy pattern of a storage node provided near a corner portion of said block of memory cells; and a dummy pattern of a cell plate covering said dummy pattern of the storage node and electrically insulated from a main cell plate of said dynamic random access memory.

2. The semiconductor memory device according to claim 1, wherein said dummy pattern of the storage node is provided to surround said corner portion of said block of memory cells.

3. The semiconductor memory device according to claim 1, wherein:

said corner portion of said block of memory cells is formed with one side and the other side; and said dummy pattern of the storage node is provided only at said one side of said corner portion.

4. The semiconductor memory device according to claim 1, wherein said dummy pattern of the storage node is formed into a rectangle in two dimensions at said corner portion of said block of memory cells.

5. A semiconductor memory device, comprising:

a semiconductor substrate;

a memory cell block of a dynamic random access memory provided on said semiconductor substrate; and said memory cell block including a storage node-block being a plurality of storage nodes gathered in a block, a corner portion of said storage node-block being cut off.

6. The semiconductor memory device according to claim 5, wherein said corner portion of said storage node-block is cut off at an angle of 45°.

7. The semiconductor memory device according to claim 5, wherein said corner portion of said storage node-block is cut off straight.

8. The semiconductor memory device according to claim 5, wherein said corner portion of said storage node-block is cut off stepwise in two dimensions.

9. The semiconductor memory device according to claim 5, wherein said corner portion of said storage node-block is cut off arcuately.

* * * * *